US012622236B2

(12) United States Patent    (10) Patent No.:   US 12,622,236 B2

Reynaud et al.    (45) Date of Patent:   May 5, 2026

---

(54) SUPPORT FOR A SEMICONDUCTOR STRUCTURE

(71) Applicant: Soitec, Bernin (FR)

(72) Inventors: Patrick Reynaud, Murianette (FR);
Marcel Broekaart, Theys (FR);
Frédéric Allibert, Grenoble (FR);
Christelle Veytizou, Bernin (FR);
Luciana Capello, Grenoble (FR);
Isabelle Bertrand, Bernin (FR)

(73) Assignee: Soitec, Bernin (FR)

( * ) Notice: Subject to any disclaimer, the term of this patent is extended or adjusted under 35 U.S.C. 154(b) by 913 days.

(21) Appl. No.: 17/805,206

(22) Filed: Jun. 2, 2022

(65) Prior Publication Data

US 2022/0301847 A1    Sep. 22, 2022

Related U.S. Application Data

(63) Continuation of application No. 16/476,415, filed as application No. PCT/EP2018/050677 on Jan. 11, 2018, now Pat. No. 11,373,856.

(30) Foreign Application Priority Data

Jan. 26, 2017   (FR) ...................................... 1750646

(51) Int. Cl.
| | |
|---|---|
| *H01L 21/02* | (2006.01) |
| *H10P 90/00* | (2026.01) |
| *H10W 10/10* | (2026.01) |

(52) U.S. Cl.
CPC .......... *H10P 90/00* (2026.01); *H10P 90/1916* (2026.01); *H10W 10/181* (2026.01)

(58) Field of Classification Search
CPC ... H01L 23/04; H01L 23/5384; H01L 23/564; H01L 23/5226; H01L 21/56; H01L 21/76898; H01L 23/3171; H01L 23/481; H01L 23/522; H01L 23/562; H01L 23/585; H10D 84/83; H10P 90/00; H10P 90/1916;

(Continued)

(56) References Cited

U.S. PATENT DOCUMENTS

| | | | |
|---|---|---|---|
| 6,544,646 | B2 | 4/2003 | Vaghefi et al. |
| 6,544,656 | B1 | 4/2003 | Abe et al. |
| 7,268,060 | B2 | 9/2007 | Ghyselen et al. |

(Continued)

FOREIGN PATENT DOCUMENTS

| | | |
|---|---|---|
| CN | 102017075 A | 4/2011 |
| FR | 2860341 B1 | 12/2005 |

(Continued)

OTHER PUBLICATIONS

Chinese First Office Action for Application No. 201880007067.4 dated Sep. 16, 2022, 9 pages.

(Continued)

*Primary Examiner* — Cuong B Nguyen

(74) *Attorney, Agent, or Firm* — TraskBritt

(57) ABSTRACT

A support for a semiconductor structure includes a base substrate, a first silicon dioxide insulating layer positioned on the base substrate and having a thickness greater than 20 nm, and a charge trapping layer having a resistivity higher than 1000 ohm·cm and a thickness greater than 5 microns positioned on the first insulating layer.

21 Claims, 2 Drawing Sheets

(58) Field of Classification Search
CPC ............... H10P 90/1918; H10P 32/302; H10P 14/69215; H10W 10/181
See application file for complete search history.

(56) References Cited

U.S. PATENT DOCUMENTS

| | | | |
|---|---|---|---|
| 7,816,205 | B2 | 10/2010 | Balseanu et al. |
| 8,772,059 | B2 | 7/2014 | Yang et al. |
| 9,129,800 | B2 | 9/2015 | Allibert et al. |
| 9,618,474 | B2 | 4/2017 | Van et al. |
| 9,768,056 | B2 | 9/2017 | Peidous et al. |
| 9,881,832 | B2 | 1/2018 | Usenko |
| 10,006,910 | B2 | 6/2018 | Hoffman |
| 10,269,976 | B2 | 4/2019 | Yamazaki |
| 10,283,401 | B2 | 5/2019 | Ishikawa et al. |
| 10,297,464 | B2 | 5/2019 | Broekaart et al. |
| 10,347,597 | B2 | 7/2019 | Kononchuk et al. |
| 2007/0013001 | A1* | 1/2007 | Furukawa ......... H01L 21/76254 257/E29.004 |
| 2007/0032040 | A1 | 2/2007 | Lederer |
| 2010/0044830 | A1* | 2/2010 | Cayrefourcq ..... H01L 21/76254 257/506 |
| 2014/0084290 | A1 | 3/2014 | Allibert et al. |
| 2015/0115480 | A1* | 4/2015 | Peidous ........... H01L 21/76251 438/479 |
| 2015/0168326 | A1 | 6/2015 | Allibert |
| 2015/0279888 | A1 | 10/2015 | Chen et al. |
| 2016/0035833 | A1 | 2/2016 | Brindle et al. |
| 2016/0071959 | A1 | 3/2016 | Thomas et al. |

FOREIGN PATENT DOCUMENTS

| | | | |
|---|---|---|---|
| FR | 2933233 | A1 | 1/2010 |
| FR | 2953640 | B1 | 2/2012 |
| FR | 3019373 | A1 | 10/2015 |
| FR | 3029682 | A1 | 6/2016 |
| JP | 2014-127590 | | 7/2014 |
| KR | 10-2007-0086316 | A | 8/2007 |
| TW | 201701453 | A | 1/2017 |
| WO | 2016/081313 | A1 | 5/2016 |
| WO | 2016/140850 | A1 | 9/2016 |
| WO | WO 2016/140850 | * | 9/2016 |

OTHER PUBLICATIONS

Taiwanese Office Action for Application No. 107101223 dated Feb. 20, 2023, 20 pages.

French Opinion for French Application No. 1750646 dated Nov. 7, 2017, 5 pages.

French Search Report for French Application No. 1750646 dated Nov. 7, 2017, 2 pages.

International Search Report for International Application No. PCT/EP2018/050677 dated Apr. 4, 2018, 3 pages.

International Written Opinion for International Application No. PCT/EP2018/050677 dated Apr. 4, 2018, 6 pages.

Japanese Official Notice of Rejection for Japanese Application No. 2019-538671 dated Dec. 14, 2021, 5 pages.

Korean Notice of Final Rejection for Korean Application No. 10-2018-7031346 dated Aug. 31, 2021, 4 pages.

Soitec, White Paper RF-SOI Wafer Characterization—White Paper, Mar. 2016, 10 pages.

Taiwanese Office Action and Search Report for Application No. 11020404280 dated May 3, 2021, 9 pages.

Chinese Decision on Rejection for Chinese Application No. 201880007067.4 dated Mar. 15, 2023, 7 pages.

Chinese Notification of Reexamination for Chinese Application No. 201880007067.4 dated May 24, 2023, 4 pages.

* cited by examiner

SUPPORT FOR A SEMICONDUCTOR STRUCTURE

CROSS-REFERENCE TO RELATED APPLICATIONS

This application is a continuation of U.S. patent application Ser. No. 16/476,415, filed Jul. 8, 2019, now U.S. Pat. No. 11,373,856, issued Jun. 28, 2022, which is a national phase entry under 35 U.S.C. § 371 of International Patent Application PCT/EP2018/050677, filed Jan. 11, 2018, designating the United States of America and published in English as International Patent Publication WO 2018/137937 A1 on Aug. 2, 2018, which claims the benefit under Article 8 of the Patent Cooperation Treaty to French Patent Application Serial No. 1750646, filed Jan. 26, 2017, the disclosure of each of which is hereby incorporated herein in its entirety by this reference.

TECHNICAL FIELD

The present disclosure relates to a support for a semiconductor structure.

BACKGROUND

Integrated devices are usually formed on substrates that mainly serve to hold them during their fabrication. However, the increase in the degree of integration and the expected performance of these devices has led to an increasingly tighter coupling of their performance and the properties of the substrate on which they are formed. This is particularly the case for RF devices processing signals the frequency of which is between about 3 kHz and 300 GHz, which are, in particular, employed in the telecommunications field (telephony, Wi-Fi, BLUETOOTH®, etc.).

By way of example of device/substrate coupling, the electromagnetic fields generated by high-frequency signals propagating through the integrated devices penetrate into the bulk of the substrate and interact with any charge carriers found there. This leads to coupling losses that consume some of the power of the signal, and possibly to crosstalk between components.

According to a second example of coupling, substrate charge carriers may generate undesired harmonics, which may interfere with the signals propagating through the integrated devices and degrade device quality.

These effects are especially observable when the substrate employed comprises a buried insulating layer between a support and a useful layer on and in which the integrated devices are formed. Charges trapped in the insulating layer cause charges of complementary sign to accumulate under this insulating layer, forming a conductive plane in the support. In this conductive plane, mobile charges are liable to interact strongly with the electromagnetic fields generated by the components of the useful layer.

To prevent or limit this effect, it is known to insert, between the buried insulating layer and the support, directly under the insulating layer, a charge trapping layer, for example, a layer of 1 to 5 microns of polycrystalline silicon. The boundaries of the grains forming the polycrystalline material then form charge traps, the trapped charge carriers possibly originating from the trapping layer itself or from the subjacent support. Thus, the formation of the conductive plane under the insulating layer is prevented. The fabrication of this type of substrate is, for example, described in documents FR2860341, FR2933233, FR2953640, US2015115480, U.S. Pat. Nos. 7,268,060 and 6,544,656.

In the presence of a trapping layer, the device/substrate coupling remains dependent on the strength of the interaction between the electromagnetic fields and the mobile charges in the support, and hence on the depth of penetration of these fields into this support. The density and/or mobility of these charges depends on the resistivity of the support.

When the resistivity of the support is relatively high (and therefore charge density relatively low), higher than 1000 ohm·cm, a trapping layer of 1 to 5 microns in thickness may be suitable for limiting device/substrate coupling, even when the electromagnetic field penetrates deeply into the support. The integrity of the signals, and hence the radiofrequency (RF) performance of the devices integrated into the useful layer, is thus preserved.

In contrast, when the resistivity of the support is lower, lower than 1000 ohm·cm, or when the performance expected from the integrated device is high, it would be desirable to be able to form a very thick trapping layer, of greater than 5 microns, or even than 10 or 20 microns, in thickness, in order to shift the zone in which the charges are mobile deeper into the substrate and to limit the depth of penetration of the electromagnetic fields into this support. Interactions with these electromagnetic fields could thus be prevented and the performance of devices integrated into the useful layer improved.

However, it has been observed that increasing the thickness of a trapping layer beyond 5 microns does not always lead to the expected improvement in performance, in particular, because this layer may recrystallize during heat treatments to which it is subjected. These heat treatments may correspond to those required to produce the substrate itself or to those required to fabricate an RF integrated device in or on the useful layer of the substrate.

In order to prevent the recrystallization of this layer, document U.S. Pat. No. 9,129,800 envisages forming a silicon oxide layer between the crystalline support and the charge trapping layer.

According to this document, this layer must necessarily have an initial thickness, before application of the heat treatment that is relatively low, between 0.5 and 10 nm, in order to have a final thickness after application of the heat treatment that is lower than 2 nm.

Stated otherwise, the initial thickness of this layer must be chosen according to the thermal budget to which the substrate will be subjected so as not to negatively affect its RF performance.

When the insulating layer is absent for the entire duration of the heat treatment, the trapping layer may recrystallize, either partially or completely. Consequently, the lower grain boundary density or the large size of these grains decreases the trapping properties of the layer.

When the final thickness of the insulating oxide layer is higher than 2 nm, it is not transparent to the charges present in the support. These charges are therefore able to pass through the insulating layer only by tunnel effect, and are not able to diffuse into the polycrystalline layer and to be trapped therein. These charges thus accumulate in the support and a conductive plane forms under the insulating layer, which has a negative effect on the RF performance of the substrate.

Choosing a suitable initial thickness for this oxide is not straightforward. Specifically, the heat treatments to which a substrate may be subjected are not always known in advance of its fabrication, in particular, those that are applied during the formation of an integrated device. However, these heat treatments may affect the quality or the thickness of this silicon dioxide insulating layer, for example, by dissolution. In this regard, it has been observed that the heat treatments in device fabrication can have high thermal budgets, which may have a significant effect on the quality of the trapping layer in the event that the oxide layer has not been chosen with a suitable thickness. This may thus be a thermal processing operation at 1200° C. for several minutes, as is the case when it is for the purpose of introducing strain into zones of the useful layer using a buried oxide creep technique or during thermal processing operations for dopant activation.

The teaching of the cited prior art document is therefore not straightforward to implement without having knowledge of the total thermal budget that the trapping layer will receive over the course of all of the steps of fabricating the substrate and the integrated devices that are to be formed on this substrate.

The present disclosure aims to overcome all or some of the aforementioned drawbacks.

BRIEF SUMMARY

With a view to achieving this aim, one subject of the disclosure provides, within its widest accepted form, a support for a semiconductor structure comprising:
   a base substrate;
   a first silicon dioxide insulating layer positioned on the base substrate and having a thickness greater than 20 nm;
   a charge trapping layer having a resistivity higher than 1000 ohm·cm and a thickness greater than 5 microns positioned on the first insulating layer.

The first insulating layer allows a thick trapping layer to be formed, this trapping layer exhibiting excellent charge trapping properties and having a low likelihood of recrystallizing. Unexpectedly, the inventors of the present disclosure have observed that the decrease in RF performance that could be caused by this insulating layer was largely compensated for by the benefits brought by the thick trapping layer, the formation of which it made possible.

According to other advantageous and non-limiting features of the disclosure that may be implemented alone or in any technically feasible combination:
   the trapping layer comprises polycrystalline silicon;
   the polycrystalline silicon is rich in carbon;
   the polycrystalline silicon comprises silicon grains having dimensions comprised between 10 nm and 900 nm;
   the trapping layer comprises amorphous or porous silicon;
   the trapping layer has a thickness greater than 10 microns;
   the trapping layer is formed from alternating layers of polycrystalline silicon and silicon dioxide;
   the base substrate has a resistivity lower than 1000 ohm·cm or than 500 ohm·cm or than 10 ohm·cm;
   the base substrate has a resistivity higher than 1000 ohm·cm or than 10 k ohm·cm;
   the base substrate is made of silicon, of quartz, of glass or of sapphire;
   the support comprises a second insulating layer positioned on the trapping layer.

According to another aspect, the subject of the disclosure provides a semiconductor structure comprising:
   a support such as described above;
   an insulating layer on this support;
   a useful layer on the insulating layer.

The useful layer may comprise at least one integrated device.

BRIEF DESCRIPTION OF THE DRAWINGS

Other features and advantages of the disclosure will become apparent from the following detailed description of the disclosure, which description is given with reference to the appended figures, in which.

DETAILED DESCRIPTION

Figure 1:
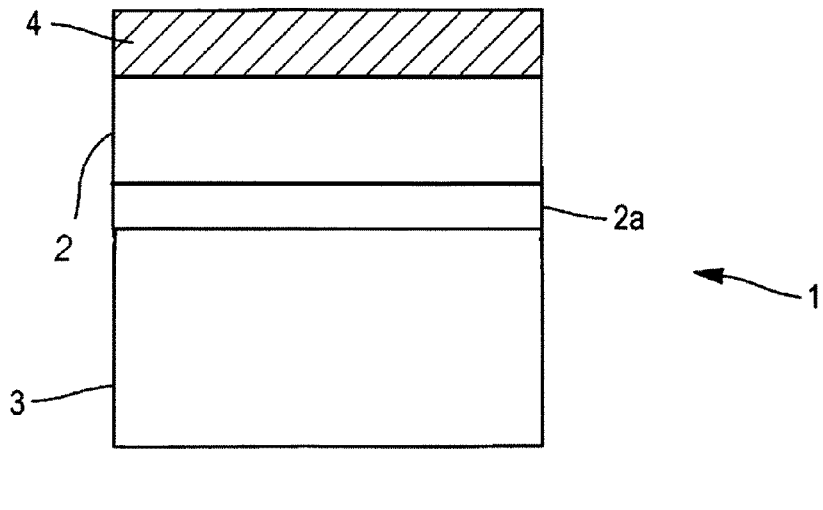
FIG. 1 schematically shows a support for a semiconductor structure according to the disclosure.
Figure 2:
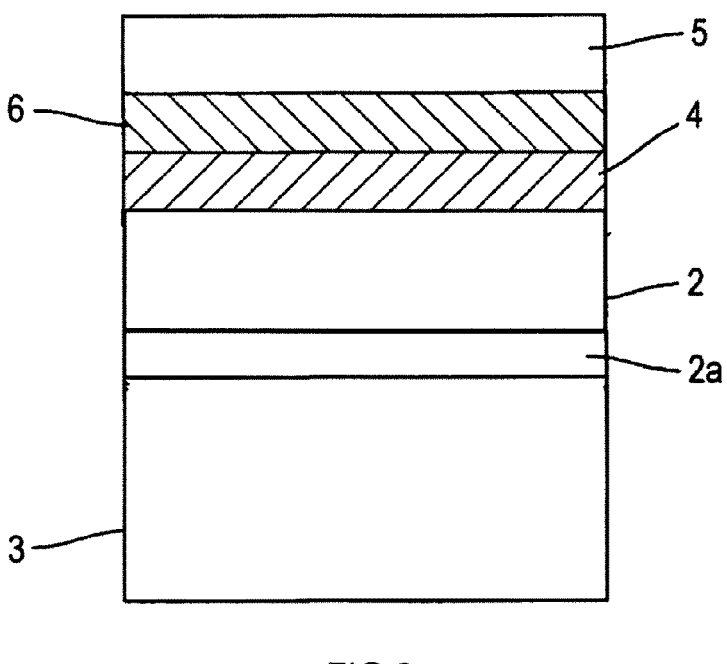
FIG. 2 shows a semiconductor-on-insulator substrate including a support according to the disclosure.

FIG. 1 schematically shows a support 1 for a semiconductor structure according to the disclosure. The support 1 may take the form of a circular wafer of standardized size, for example, of 200 mm or 300 mm or even 450 mm in diameter. However, the disclosure is in no way limited to these dimensions or to this shape.

Thus, in the case where the semiconductor structure is to be a finished or semi-finished integrated device, the support 1 will take the form of a block of material of rectangular or square longitudinal cross section the dimensions of which, from a few millimeters to a few centimeters, correspond to the dimensions of the integrated device.

The support 1 comprises a base substrate 3, which is typically a few hundred microns in thickness. Preferably, and especially when the support 1 is intended to receive a semiconductor structure for which the expected RF performance is high, the base substrate has a high resistivity, higher than 1000 ohm·centimeter, and even more preferably higher than 3000 ohm·centimeter. The density of charges, i.e., holes or electrons, that are liable to move in the base substrate is thus limited. However, the disclosure is not limited to a base substrate having such a resistivity, and it also provides advantages in terms of RF performance when the base substrate has a more usual resistivity, of about a few hundred ohm·centimeters, for example, lower than 1000 ohm·cm, or than 500 ohm·cm or than 10 ohm·cm.

For reasons of availability and cost, the base substrate 3 is preferably made of monocrystalline silicon. It may, for example, be a CZ substrate containing a small amount of interstitial oxygen, this type of substrate, as is well known per se, having a resistivity that may be higher than 1000 ohm·cm. The base substrate may alternatively be formed from another material: it may, for example, be made of sapphire, of glass, of quartz, of silicon carbide, etc.

The support 1 also includes, positioned on and making direct contact with the base substrate 3, a first silicon dioxide insulating layer 2a. The first silicon dioxide insulating layer 2a has a thickness greater than 20 nm, such as, for example, between 20 nm and 20 microns. It may be obtained by oxidation of the base substrate 3 or by deposition on the base substrate 3. In order to limit the time and cost required to form the first insulating layer 2a, its thickness may be chosen so that it is between 100 and 200 nm, such as, for example, 145 nm.

Above a thickness of 20 nm, the first insulating layer is stable with temperature, even for high thermal budgets. It may, in particular, be exposed to temperatures higher than or equal to 1200° C. for a duration of several hours without breaking down, for example, by dissolution.

The support 1 also includes, positioned on and making direct contact with the first silicon dioxide insulating layer 2*a*, a trapping layer 2. The trapping layer 2 has a resistivity higher than 1000 ohm·cm, preferably higher than 10 kohm·cm. As was mentioned above in detail in the introduction of the present application, the function of the trapping layer 2 is to trap any charge carriers present in the support 1 and to limit their mobility. This is especially the case when the support 1 is provided with a semiconductor structure that emits an electromagnetic field that penetrates into the support 1 and that may therefore interact with and mobilize these charges.

The trapping layer 2 may, in general, comprise a non-crystalline semiconductor layer having structural defects such as dislocations, grain boundaries, amorphous zones, interstices, inclusions, pores, etc. The structural defects form traps for any charges flowing through the material, for example, at the site of incomplete or dangling chemical bonds. Conduction is thus prevented in the trapping layer, which consequently exhibits high resistivity. Since the trapping layer 2 does not make direct contact with the support 1 but with the amorphous insulating layer 2*a*, the trapping properties of this layer may be conserved even when the support undergoes a very high heat treatment. The structural defects are unlikely to undergo recrystallization.

For the same reasons of availability and cost that were mentioned above, the trapping layer 2 is preferably made of polycrystalline silicon. However, it may be formed from or comprise another polycrystalline semiconductor material. Alternatively, the trapping layer 2 may be formed from or comprise amorphous or porous silicon.

It is also possible to envisage inserting at least one intermediate layer into the trapping layer 2, for example, a carbon layer or a layer a mixture of carbon and silicon. The intermediate layer may also comprise, or be formed from, silicon oxide or silicon nitride. In this case, the trapping layer 2 is then formed from alternating layers of polycrystalline silicon (or of another material, or of an amorphous or porous material) and intermediate layers of a different nature (of silicon dioxide or nitride, of carbon, etc.).

In any case, the trapping layer 2 has a high resistivity higher than 1000 ohm·cm. To this end, the trapping layer 2 is not intentionally doped, i.e., it has a charge carrier dopant concentration lower than 10 E14 atoms per cubic centimeter. It may be rich in nitrogen or in carbon in order to improve its resistivity characteristic.

The fabrication of the trapping layer 2 on the base substrate 3 provided with the first silicon dioxide insulating layer 2*a* is particularly straightforward and achievable using industry-standard deposition equipment. It may thus involve RPCVD (remote plasma-enhanced chemical vapor deposition) or PECVD (plasma-enhanced chemical vapor deposition). It may also involve LPCVD (low-pressure chemical vapor deposition).

Unexpectedly, the inventors of the present disclosure have observed that a trapping layer 2 based on polycrystalline silicon produced on the first silicon dioxide insulating layer 2*a* and having a thickness greater than 20 nm was formed from grains the dimensions of which, typically between 10 and 900 nm, were particularly suitable for effective charge trapping. Moreover, the dimensions of these grains are relatively constant throughout the thickness of the trapping layer 2, even when the thickness of the trapping layer 2 is substantial. These properties are also conserved after the trapping layer 2 has been exposed to a thermal budget, even to a high thermal budget.

It has been observed that grain size directly affects the RF performance of the support in two ways. Firstly, larger grains lead to a lower density of grain boundaries in the material. Since these boundaries form a prime zone of charge trapping, trap density is decreased.

Furthermore, the grains also form a confining space for the charge carriers that reside therein. In grains of substantial size, for example, of the order of the size of an integrated device, the charges behave, as seen by the device, as in a defect-free material.

These two aspects combine to decrease the RF performance of the support, when the grains of the polycrystalline material of the trapping layer 2 are of substantial sizes.

Complementary studies have shown that the size of the grains should preferably be between 100 nm (below which their thermal stability is no longer ensured and hence there is a risk that they will recrystallize with temperature) and 1000 nm (above which the RF performance of the support is affected).

A support 1 according to the disclosure may therefore have a thick trapping layer 2, having a thickness greater than 5 microns, and potentially reaching 10 microns or 20 microns, comprising a polycrystalline silicon material formed from grains the size of which is between 10 and 900 nm. As mentioned above, one or a plurality of intermediate layers may be provided within the trapping layer 2 in order to limit the size of the grains of each polycrystalline layer, this tending to increase with thickness. In order to promote the formation of small grains, it is thus possible to choose to limit the thickness of the polycrystalline layers positioned between two intermediate layers to 1 micron in thickness or less.

It should be noted that the cited prior art document recommends against placing a thick first silicon dioxide insulating layer 2*a* between the trapping layer 2 and the base substrate 3, as recommended by the present disclosure. Specifically, and according to this document, the presence of charges in this insulator leads to the formation of a conductive plane consisting of charges of complementary sign in the base substrate 3, under the first silicon dioxide insulating layer 2*a*. This conductive plane affects the radiofrequency performance of the support 1.

Surprisingly, the inventors of the present disclosure have observed however that this loss of performance was in fact less than the gain obtained by forming a trapping layer 2 having a thickness greater than 5 microns, so that the total RF performance of the support 1 is overall improved thereby.

By forming a trapping layer having a thickness greater than 5 microns, only the electromagnetic fields penetrating very deeply into the bulk of the base substrate 3 may affect the mobile charges present in the substrate. These fields constitute only a minor portion of the fields penetrating into the support, in particular, when the signals from which they originate have a very high frequency, such as, for example, higher than a gigahertz.

The accumulation of charges under the first silicon dioxide insulating layer 2*a* and the interaction of these charges with the electromagnetic fields penetrating sufficiently deeply into the support leads to a decrease in RF performance. However, unexpectedly, this decrease is largely compensated for by the increase in the RF performance related to the substantial thickness, greater than 5 microns, of the trapping layer 2.

Figure 3:
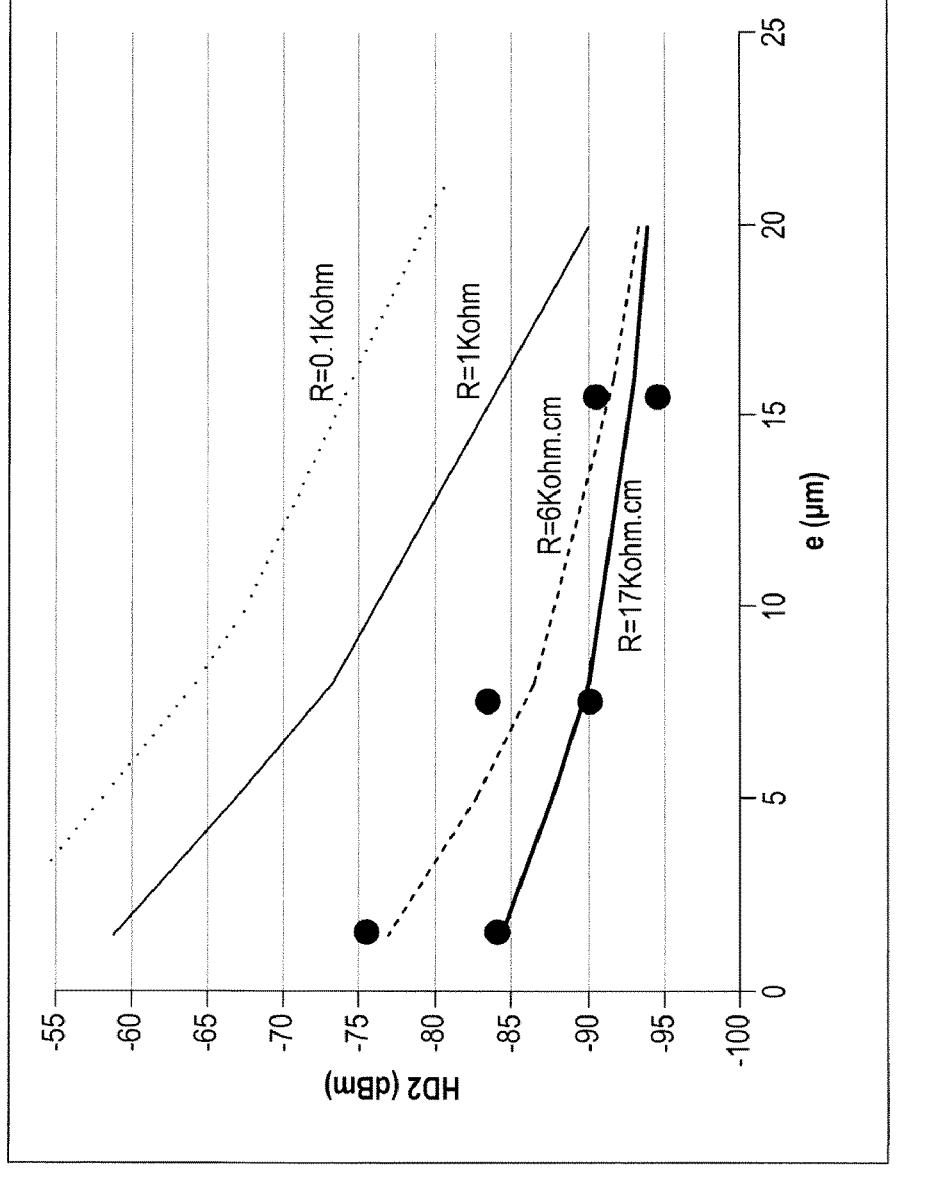
FIG. 3 presents, in the form of a graph, experimental measurements made on a support according to the disclosure.

The graph of FIG. 3 presents the results of a series of experiments and simulations prepared by the applicant.

A plurality of supports having different characteristics and in accordance with the disclosure have been prepared. These supports comprise a base substrate consisting of a silicon wafer having a diameter of 300 mm and a resistivity of 17.6 k·ohms. The base substrates have each been provided with a silicon dioxide insulating layer having a thickness of 145 nm by thermal oxidation. A trapping layer made of polycrystalline silicon has been formed on this insulating layer by RPCVD, this layer having a thickness of 2 microns, 7 microns, and 16 microns.

A characterization measurement, referred to as a second harmonic distortion measurement, has then been performed on each of the supports prepared in this way. This measurement is made at 900 MHz. To this end, a silicon dioxide layer and coplanar metallic lines have been formed on each support.

This characterization measurement, a detailed description of which will be found in the document titled "White paper—RF SOI wafer characterization," January 2015, published by Soitec and in the document US2015/0168326, is particularly relevant since it is very representative of the performance of an RF integrated device that would be formed on the characterized support.

The axis of the abscissae of the graph of FIG. 3 represents the thickness "e" of the trapping layer 2, in microns. The axis of the ordinates represents the second harmonic distortion measurement (denoted by HD2) in dBm.

The six measurements made have been represented by points on the graph of FIG. 3. These measurement points have made it possible to calibrate a simulation of the second harmonic distortion measurement for a support having a base substrate of determined resistivity and having a polycrystalline silicon trapping layer of determined thickness. The simulation measurements are represented on the graph of FIG. 3 by solid lines for various resistivity values of the base substrate.

It has been observed that the RF performance of all of the supports is improved when the thickness of the polycrystalline silicon layer increases. More specifically, performance is notably increased when the thickness of the trapping layer is greater than 5 microns. The presence of the insulating layer does not limit the level of performance that may be reached. These levels of performances are expected to be stable regardless of the temperature to which the support could be exposed, since the insulating layer prevents the recrystallization of the polycrystalline trapping layer.

Returning to the description of the support 1 shown in FIG. 1, a second insulating layer 4 optionally may be provided on the trapping layer 2 and in direct contact therewith, in order to facilitate the assembly of the support 1 with a semiconductor structure. This second insulating layer 4 may be formed by deposition or by oxidation of the trapping layer 2. Provision may be made for a polishing step before and/or after the formation of the second insulating layer 4, in order to improve the quality of this assembly.

As mentioned above, the support 1 is intended to receive a semiconductor structure on the side of the trapping layer 2.

This structure may be formed in multiple ways on the support 1, but advantageously this formation comprises a step of transferring a useful layer 5 to the support. As is well known per se, this transfer is usually achieved by bonding the face of a donor substrate to the support 1. The latter may or may not be provided with the insulating layer 4. In the same way, the donor substrate may have been provided beforehand with another insulating layer 6 of the same nature or of a different nature to the second insulating layer 4. It may, for example, be a silicon oxide or silicon nitride. The assembly may undergo a strengthening heat treatment, even one having a high thermal budget, since the trapping layer 2 of the support is not liable to recrystallize by virtue of the presence of the first silicon dioxide insulating layer 2a. The strengthening heat treatment may correspond to thermal processing for several hours at 1200° C., which is generally required for fully strengthening a bond bringing two silicon oxide layers into contact.

After this bonding step, the thickness of the donor substrate is decreased to form the useful layer 5. This decreasing step may be a step of mechanical or chemical thinning. It may also be a fracture level with a fragile zone introduced beforehand into the donor substrate, for example, according to the principles of the Smart Cut™ technology.

A sequence of steps for finishing the useful layer 5, such as a polishing step, a heat treatment under a reducing or inert atmosphere, and a sacrificial oxidation may be carried out after the thickness-decreasing step.

When the donor substrate is a simple semiconductor substrate, i.e., one that comprises no integrated devices, a semiconductor-on-insulator substrate is thus formed, in which, as is shown in FIG. 3, the useful layer 5 is a virgin semiconductor layer comprising the support of the present disclosure. The substrate may then be used to form integrated devices.

When the donor substrate has been processed beforehand to form integrated devices on its surface, a useful layer 5 that comprises these devices is obtained at the end of this process.

Of course, the disclosure is not limited to the described embodiments and variant embodiments may be rendered therefrom without departing from the scope of the invention such as defined by the claims.

The expression "semiconductor structure" irrespectively refers to an integrated device whether the latter be formed from semiconductor materials or not. For example, it may be a surface or bulk acoustic wave type device, typically produced on and in a layer made of piezoelectric material, such as lithium tantalate.

The expression "semiconductor structure" also refers to a layer (or a plurality of layers) of virgin device material, whether based on semiconductor materials or not, and in which integrated devices may be formed.

What is claimed is:

1. A support for a semiconductor structure, comprising:
   a base substrate comprising one or more of silicon carbide and monocrystalline silicon;
   a silicon dioxide insulating layer on the base substrate, the silicon dioxide insulating layer having a thickness between 100 nm and 200 nm;
   a charge trapping layer on the silicon dioxide insulating layer, the charge trapping layer having a total thickness greater than 5 microns;
   an insulating layer on the charge trapping layer, wherein the insulating layer is silicon oxide or silicon nitride;
   a donor substrate on the insulating layer, wherein the donor substrate is silicon oxide or silicon nitride; and
   a useful layer over the insulating layer, the useful layer being formed from the donor substrate.

2. The support for the semiconductor structure of claim 1, wherein the base substrate comprises Czochralski (CZ) silicon containing interstitial oxygen.

3. The support for the semiconductor structure of claim 1, wherein the charge trapping layer comprises an alternating stack of at least one layer of charge trapping material and at least one intermediate layer.

4. The support for the semiconductor structure of claim 3, wherein the at least one intermediate layer comprises one or more of carbon, silicon oxide, and silicon nitride.

5. The support for the semiconductor structure of claim 3, wherein the at least one layer of charge trapping material has a thickness of 1 micron or less.

6. A semiconductor structure, comprising:

a silicon dioxide insulating layer on a base substrate, the silicon dioxide insulating layer having a thickness greater than 20 nm;

a charge trapping layer on the silicon dioxide insulating layer, the charge trapping layer having a thickness greater than 5 microns;

an insulating layer on the charge trapping layer, wherein the insulating layer is silicon oxide or silicon nitride;

a donor substrate on the insulating layer, wherein the donor substrate is silicon oxide or silicon nitride; and a useful layer over the charge trapping layer and the insulating layer, the useful layer being formed from the donor substrate.

7. The semiconductor structure of claim 6, wherein the useful layer comprises a piezoelectric material.

8. The semiconductor structure of claim 7, wherein the piezoelectric material is lithium tantalate.

9. A method of forming a support for a semiconductor structure, the method comprising:

forming a silicon dioxide insulating layer on a base substrate, the silicon dioxide insulating layer having a thickness between 100 nm and 200 nm;

depositing a charge trapping layer on the silicon dioxide insulating layer, the charge trapping layer having a total thickness greater than 5 microns;

depositing an insulating layer on the charge trapping layer, wherein the insulating layer is silicon oxide or silicon nitride;

depositing a donor substrate on the insulating layer, wherein the insulating layer is silicon oxide or silicon nitride; and forming a useful layer from the donor substrate.

10. The method of claim 9, wherein the base substrate comprises silicon and forming the silicon dioxide insulating layer on the base substrate comprises oxidizing an upper portion of the base substrate.

11. The method of claim 9, wherein the charge trapping layer has a resistivity higher than 1000 ohm·cm.

12. The method of claim 9, wherein depositing a charge trapping layer on the silicon dioxide insulating layer comprises depositing the charge trapping layer by one or more of a plasma-enhanced chemical vapor deposition (PECVD) process, a remote plasma-enhanced chemical vapor deposition (RPCVD) process, and a low-pressure chemical vapor deposition (LPCVD) process.

13. The method of claim 9, wherein forming the charge trapping layer on the first silicon dioxide insulating layer comprises forming at least one intermediate layer within the charge trapping layer, such that the charge trapping layer comprises alternating layers of a charge trapping material and the at least one intermediate layer.

14. The method of claim 9, wherein the base substrate comprises one or more of silicon, sapphire, glass, quartz, and silicon carbide.

15. The method of claim 9, wherein the charge trapping layer is rich in carbon or nitrogen.

16. A method of forming a semiconductor structure, the method comprising:

forming a silicon dioxide insulating layer on a base substrate, the silicon dioxide insulating layer having a thickness greater than 20 nm;

forming a charge trapping layer on the silicon dioxide insulating layer to form a support structure, the charge trapping layer having a resistivity higher than 1000 ohm·cm and a thickness greater than 5 microns;

forming an insulating layer on the charge trapping layer, wherein the insulating layer is silicon dioxide or silicon nitride;

bonding a donor substrate to the support structure over the charge trapping layer and the insulating layer, wherein the donor substrate is silicon dioxide or silicon nitride; and thinning the donor substrate to form a useful layer on the support structure.

17. The method of claim 16, further comprising, before bonding a donor substrate to the support structure, forming an insulating layer on the charge trapping layer.

18. The method of claim 17, wherein forming an insulating layer on the charge trapping layer comprises one of oxidizing an upper portion of the charge trapping layer to form the insulating layer or depositing the insulating layer on the charge trapping layer.

19. The method of claim 16, wherein the donor substrate comprises an insulating layer on a surface thereof and the donor substrate is bonded to the support structure along a surface of the insulating layer.

20. The method of claim 16, wherein thinning the donor substrate to form a useful layer on the support structure comprises:

forming a fragile zone in the donor substrate to delineate the useful layer; and detaching the donor substrate along the fragile zone to obtain the useful layer detached from the donor substrate.

21. The method of claim 16, wherein the donor substrate comprises at least one integrated device on a surface thereof, and, after thinning the donor substrate, the useful layer comprises the at least one integrated device.

* * * * *